United States Patent
Yamazaki

(10) Patent No.: US 9,546,416 B2
(45) Date of Patent: Jan. 17, 2017

(54) METHOD OF FORMING CRYSTALLINE OXIDE SEMICONDUCTOR FILM

(75) Inventor: Shunpei Yamazaki, Setagaya (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 998 days.

(21) Appl. No.: 13/221,140

(22) Filed: Aug. 30, 2011

(65) Prior Publication Data

US 2012/0060750 A1    Mar. 15, 2012

(30) Foreign Application Priority Data

Sep. 13, 2010   (JP) .................... 2010-204199

(51) Int. Cl.
| | | |
|---|---|---|
| C30B 25/00 | (2006.01) |
| C23C 14/08 | (2006.01) |
| C23C 14/54 | (2006.01) |
| C23C 14/56 | (2006.01) |
| C30B 29/16 | (2006.01) |
| C30B 25/10 | (2006.01) |

(52) U.S. Cl.
CPC ............. *C23C 14/08* (2013.01); *C23C 14/086* (2013.01); *C23C 14/541* (2013.01); *C23C 14/564* (2013.01); *C30B 25/10* (2013.01); *C30B 25/105* (2013.01); *C30B 29/16* (2013.01)

(58) Field of Classification Search
CPC .................................. C30B 29/16; C30B 29/22
USPC ..................................... 117/88, 84
See application file for complete search history.

(56) References Cited

U.S. PATENT DOCUMENTS

| 5,313,075 A | 5/1994 | Zhang et al. |
| 5,583,369 A | 12/1996 | Yamazaki et al. |
| (Continued) | | |

FOREIGN PATENT DOCUMENTS

| EP | 1737044 A | 12/2006 |
| EP | 1770788 A | 4/2007 |
| (Continued) | | |

OTHER PUBLICATIONS

Kamiya. T et al., "Carrier transport properties and electronic structures of amorphous oxide semiconductors: the present status", Solid State Physics, Sep. 1, 2009, vol. 44, No. 9, pp. 621-633, Agne Gijutsu Center.

(Continued)

*Primary Examiner* — Michael Kornakov
*Assistant Examiner* — Hua Qi
(74) *Attorney, Agent, or Firm* — Robinson Intellectual Property Law Office; Eric J. Robinson

(57) ABSTRACT

An oxide semiconductor film with excellent crystallinity is formed. At the time when an oxide semiconductor film is formed, as a substrate is heated to a temperature of higher than or equal to a first temperature and lower than a second temperature, a part of the substrate having a typical length of 1 nm to 1 µm is heated to a temperature higher than or equal to the second temperature. Here, the first temperature means a temperature at which crystallization occurs with some stimulation, and the second temperature means a temperature at which crystallization occurs spontaneously without any stimulation. Further, the typical length is defined as the square root of a value obtained in such a manner that the area of the part is divided by the circular constant.

32 Claims, 6 Drawing Sheets

(56) References Cited

U.S. PATENT DOCUMENTS

| | | |
|---|---|---|
| 5,605,846 A | 2/1997 | Ohtani et al. |
| 5,731,856 A | 3/1998 | Kim et al. |
| 5,744,864 A | 4/1998 | Cillessen et al. |
| 5,824,574 A | 10/1998 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,828,179 B2 | 12/2004 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,563,661 B2 | 7/2009 | Tanaka |
| 7,674,650 B2 | 3/2010 | Akimoto et al. |
| 7,732,819 B2 | 6/2010 | Akimoto et al. |
| 7,910,490 B2 | 3/2011 | Akimoto et al. |
| 7,932,521 B2 | 4/2011 | Akimoto et al. |
| 8,274,077 B2 | 9/2012 | Akimoto et al. |
| 8,466,463 B2 | 6/2013 | Akimoto et al. |
| 8,629,069 B2 | 1/2014 | Akimoto et al. |
| 8,669,550 B2 | 3/2014 | Akimoto et al. |
| 8,748,879 B2 | 6/2014 | Yano et al. |
| 8,790,959 B2 | 7/2014 | Akimoto et al. |
| 8,796,069 B2 | 8/2014 | Akimoto et al. |
| 9,099,562 B2 | 8/2015 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0048706 A1 | 3/2005 | Shimomura et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0280119 A1* | 11/2008 | Kishimoto et al. ........... 428/220 |
| 2008/0296568 A1 | 12/2008 | Ryu et al. |
| 2008/0308796 A1 | 12/2008 | Akimoto et al. |
| 2008/0308805 A1* | 12/2008 | Akimoto ............ H01L 27/1225 257/59 |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0181552 A1 | 7/2009 | Shimomura et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0062432 A1 | 3/2011 | Yamazaki et al. |
| 2011/0062436 A1 | 3/2011 | Yamazaki et al. |
| 2011/0104851 A1 | 5/2011 | Akimoto et al. |
| 2011/0121290 A1 | 5/2011 | Akimoto et al. |

FOREIGN PATENT DOCUMENTS

| | | |
|---|---|---|
| EP | 1995787 A | 11/2008 |
| EP | 1998373 A | 12/2008 |
| EP | 1998374 A | 12/2008 |
| EP | 1998375 A | 12/2008 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2007-235118 A | 9/2007 |
| JP | 2007-258468 A | 10/2007 |
| JP | 2009-021612 A | 1/2009 |
| JP | WO 2010018875 A1 * | 2/2010 ....... H01L 21/02554 |

(56) References Cited

FOREIGN PATENT DOCUMENTS

| WO | WO-2004/114391 | 12/2004 |
|---|---|---|
| WO | WO-2008/136505 | 11/2008 |
| WO | WO-2009/034953 | 3/2009 |

OTHER PUBLICATIONS

Kamiya.T et al., "Origins of High Mobility and Low Operation Voltage of Amorphous Oxide TFTs: Electronic Structure, Electron Transport, Defects and Doping,", Journal of Display Technology, Jul. 1, 2009, vol. 5, No. 7, pp. 273-288.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No, 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung,T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using Cg-Silicon Technology", SID Digest '04 : SID International Symposium of Technical Papers, 2004, vol. 35, pp. 860-863.

Janotti.A et al., "Native Point Defects in ZnO", Phys. Rev. B (Physical Review. B), Oct. 4, 2007, vol. 76, No. 16, pp. 165202-1-165202-22.

Janotti.A et al., "Oxygen Vacancies in ZnO", Appl, Phys. Lett. (Applied Physics Letters) , 2005, vol. 87, pp. 122102-1-122102-3.

Jeong.J et al., "3.1: Distinguished Paper: 12.1-Inch WXGA AMOLED Display Driven by Indium-Gallium-Zinc Oxide TFTs Array", SID International Symposium Digest of Technical Papers, May 20, 2008, vol. 39, No. 1, pp. 1-4.

Jin.D et al., "65.2:Distinguished Paper:World-Largest (6.5") Flexible Full Color Top Emission AMOLED Display on Plastic Film and Its Bending Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composited for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, fe, Ni, Cu, or Zn] at Temperatures over 1000° C.", Journal of Solid State Chemistry, 1985, vol. 60, pp. 382-384.

Kimizuka.N. et al., "Syntheses and Single-Crystal Data of Homologous Compounds, In2O3(ZnO)m (m=3, 4, and 5), InGaO3(ZnO)3, and GaO3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits , 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98. pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 58-584.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m <4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. 8 (Physical Review. B), Jan. 15, 2000, vol. 61, No. 3, pp. 1811-1816.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Kamiya T et al., "Carrier transport properties and electronic structures of amorphous oxide semiconductors: the present status", Solid State Physics, Sep. 1, 2009, vol. 44, No. 9, pp. 621-633, Agne Gijutsu Center.

\* cited by examiner

203a 207a  207b

209

METHOD OF FORMING CRYSTALLINE OXIDE SEMICONDUCTOR FILM

BACKGROUND OF THE INVENTION

1. Field of the Invention

One embodiment of the present invention relates to a method of forming a crystalline oxide semiconductor film used for manufacturing a semiconductor device. Note that a semiconductor device in this specification refers to any device that utilizes semiconductor properties. Therefore, for example, a display device, a semiconductor circuit, and an electronic device which include a semiconductor element such as a transistor or a diode are all semiconductor devices.

2. Description of the Related Art

Recently, an oxide semiconductor having semiconductor characteristics has attracted attention. Examples of the oxide semiconductor having semiconductor characteristics include tungsten oxide, tin oxide, and an indium-gallium-zinc-based oxide (In—Ga—Zn-based oxide), and a thin film transistor in which such an oxide having semiconductor characteristics is used for a channel formation region is known (Patent Documents 1 and 2). Further, in particular, properties of an In—Ga—Zn-based oxide have been researched (Non-Patent Document 1).

REFERENCE

Patent Document

[Patent Document 1] Japanese Published Patent Application No. 2007-123861
[Patent Document 2] Japanese Published Patent Application No. 2007-96055

Non-Patent Document

[Non-Patent Document 1] Kamiya, Nomura, and Hosono, "Carrier Transport Properties and Electronic Structures of Amorphous Oxide Semiconductors: The present status", KOTAI BUTSURI (SOLID STATE PHYSICS), 2009, Vol. 44, pp. 621-633

SUMMARY OF THE INVENTION

Conventionally, it has been reported that in an oxide in which the overlap of s orbitals causes electric conduction, in particular, an oxide of indium or the like, the electron-transport properties (typically, field effect mobility) do not vary significantly depending on the crystallinity. Further, in terms of mass production, it has been preferable that an oxide be in an amorphous state with few variations (see Non-Patent Document 1).

However, the inventor found out that reliability such as the stability of the threshold voltage of the transistor including an amorphous material is not sufficient in the case where a high voltage is applied to the transistor or the transistor is irradiated with light, and in terms of the reliability, a material with high crystallinity is preferable. One of the reasons why the reliability of a crystalline oxide semiconductor is superior to the reliability of an amorphous oxide semiconductor will be described below.

In the crystalline oxide semiconductor, metal atoms and oxygen atoms are bonded ( . . . -M-O-M- . . . ; O is an oxygen atom, and M is a metal atom) in an orderly manner in comparison with the amorphous oxide semiconductor. That is, in the case of the amorphous oxide semiconductor, the coordination numbers can vary depending on the individual metal atoms, while in the case of the crystalline oxide semiconductor, the coordination numbers are substantially the same. Therefore, microscopic oxygen vacancies can be reduced, and instability and transfer of electric charge due to attachment and detachment of a hydrogen atom (including a hydrogen ion) or an alkali metal atom in a "space" explained later can be reduced.

On the other hand, in the case of the amorphous structure, the concentration of metal atoms and oxygen atoms are microscopically uneven due to a variation in the coordination numbers depending on the individual metal atoms, and depending on location, there is an area which has no atom ("space") in some cases. In such a "space," for example, a hydrogen atom (including a hydrogen ion) or an alkali metal atom is captured, and is boded with oxygen in some cases. Further, it is also possible that the atom is transferred through the "space."

The transfer of atoms as described above causes changes in the characteristics of the oxide semiconductor. Accordingly, the existence of the atoms is a significant problem in terms of reliability. Specifically, since the transfer of atoms occurs by applying a high electric field or light energy, the characteristics of the oxide semiconductor are not stable in the case of using the oxide semiconductor in such a condition. That is, the reliability of the amorphous oxide semiconductor is inferior to the reliability of the crystalline oxide semiconductor in such a case.

Note that also in the crystalline oxide semiconductor, it is possible that the above-described "space" is formed in, for example, a grain boundary. That is, it can be said that, as well as the amorphous oxide semiconductor, the crystalline oxide semiconductor having a grain boundary has a problem in reliability.

Further, in addition to the above-described problem in reliability, forming semiconductor elements using a material with insufficient crystallinity (in particular, a polycrystalline material having a disordered crystal orientation) may cause a variation in characteristics due to a variation in crystallinity. For the above reason, the material for semiconductor elements is required to be a highly-ordered crystalline material having as few grain boundaries and defects as possible. This is strongly required, in particular, in the case of using a semiconductor element having a channel length and a channel width of less than or equal to 0.5 μm.

The present invention has been made in view of the above-described situation. One embodiment of the present invention provides a method of forming an oxide semiconductor film with high crystallinity. In addition, an object of one embodiment of the present invention is to provide a novel semiconductor device. Further, another object of one embodiment of the present invention is to provide a method of manufacturing a novel semiconductor device.

As one embodiment of the present invention, at the time when an oxide semiconductor film is formed, while a substrate is heated to a temperature of higher than or equal to a first temperature and lower than a second temperature, a certain part of the substrate is irradiated with an energy line such as an electron beam or an electromagnetic wave (including visible light or ultraviolet light), so that the temperature of a part of the substrate having a typical length of 1 nm to 1 μm is higher than or equal to the second temperature.

As one embodiment of the present invention, at the time when an oxide semiconductor film is formed by a sputtering method, while a substrate is heated to a temperature of higher than or equal to a first temperature and lower than a second temperature, heating is performed so that the temperature of a certain part of the substrate having a typical length of 1 nm to 1 μm is higher than or equal to the second temperature.

As one embodiment of the present invention, at the time when an oxide semiconductor film is formed by a sputtering method, while a substrate is heated to a temperature of higher than or equal to a first temperature and lower than a second temperature, a certain part of the substrate is irradiated with an energy line such as an electron beam or an electromagnetic wave (including visible light or ultraviolet light), so that the temperature of a part of the substrate having a typical length of 1 nm to 1 μm is higher than or equal to the second temperature.

Here, the first temperature means a temperature at which crystallization occurs with some stimulation, and the second temperature means a temperature at which crystallization occurs spontaneously without any stimulation. Further, the typical length means a length defining the size of a part in which the temperature is higher than or equal to the second temperature, and the typical length is defined as the square root of a value obtained in such a manner that the area of the part is divided by the circular constant. In the case where the area has a circular shape, the radius of the area corresponds to the typical length. Note that the shape of the above-described area is not limited to a circular shape, and the shape can be square, rectangular, oval, or the like.

When film formation is performed in the above-described condition, only the area where the temperature is higher than or equal to the second temperature is primarily crystallized. As the temperature of the other part is higher than or equal to the first temperature, if the adjacent part is crystallized, the other part is also crystallized due to the stimulation by the crystallized adjacent part. In other words, the crystallization proceeds from the area crystallized primarily to the surrounding area. Furthermore, the crystal is grown while keeping the crystal orientation of the area crystallized primarily.

Note that a similar situation possibly occurs by heat treatment performed on a material in an amorphous state, which is formed. In such a case, it is difficult that a film is entirely crystallized, and specifically, when a material in an amorphous state formed over a substrate (e.g., glass) in an amorphous state is used, the film in the vicinity of the interface between the film and the substrate is hardly crystallized in the case where the temperature is lower than the second temperature. This is because the material in an amorphous state is already in a solid state, and high energy is required for movement of atoms.

In contrast, the movement of atoms easily occurs in the film formation, and thus, the rearrangement at the atomic level occurs; as a result, the crystal growth occurs easily. Accordingly, the volume of the above-described area in an amorphous state can be sufficiently reduced.

In the above-description, the first temperature and the second temperature vary depending on the oxide semiconductor material. For example, zinc oxide and indium oxide are crystallized spontaneously at room temperature, and thus, both the first temperature and the second temperature are low. On the other hand, in some of the In—Ga—Zn-based oxide (specifically, the one which has high concentration of gallium), a spontaneous crystallization does not occur unless the temperature is higher than or equal to 250° C., so that the second temperature of the oxide is higher than or equal to 250° C.

The size of the area crystallized primarily is an important factor to obtain an excellent crystalline oxide semiconductor film. For example, in the case where the area has many crystals, as the surrounding crystals are crystallized due to the influence of the crystal orientation of those crystals, the crystalline oxide semiconductor film obtained is a film of which the crystal orientation is not uniform and which includes crystal grain boundaries.

In contrast, in the case where only one crystal exists in the area crystallized primarily, as the surrounding crystals are crystallized due to the influence of the crystal orientation of the one crystal, the crystalline oxide semiconductor film obtained is a single crystal film or a substantially single crystal film.

The size of the area to be crystallized primarily varies depending on the oxide semiconductor material. It may be considered that the size of the area to be crystallized primarily is substantially equal to the diameter of a crystal grain obtained by spontaneous crystal growth; for example, the diameter of a crystal grain of zinc oxide or indium oxide obtained by spontaneous crystal growth is about several hundred nm, and the diameter of a crystal grain of the In—Ga—Zn-based oxide is several nm.

Note that it is required to reduce impurities in a target used for the film formation by sputtering as few as possible in order to obtain a crystalline oxide semiconductor film with few defects. Examples of the impurities are hydrogen atoms, hydrogen ions, an alkali metal, an alkaline earth metal and the like.

Specifically, the concentration of an alkali metal in the target, which is measured by secondary ion mass spectroscopy (SIMS) is set to be lower than or equal to $5 \times 10^{16}$ cm$^{-3}$, and the concentration of hydrogen is set to be lower than or equal to $1 \times 10^{18}$ cm$^{-3}$, preferably lower than or equal to $1 \times 10^{17}$ cm$^{-3}$, further preferably lower than $1 \times 10^{16}$ cm$^{-3}$. In this manner, a high-quality crystalline oxide semiconductor film can be obtained.

More specifically, the concentration of sodium measured by SIMS is set to be lower than or equal to $5 \times 10^{16}$ cm$^{-3}$, preferably lower than or equal to $1 \times 10^{16}$ cm$^{-3}$, further preferably lower than or equal to $1 \times 10^{15}$ cm$^{-3}$. Further, the concentration of lithium measured by SIMS is set to be lower than or equal to $5 \times 10^{15}$ cm$^{-3}$, preferably lower than or equal to $1 \times 10^{15}$ cm$^{-3}$. Furthermore, the concentration of potassium measured by SIMS is set to be lower than or equal to $5 \times 10^{15}$ cm$^{3}$, preferably lower than or equal to $1 \times 10^{15}$ cm$^{-3}$.

To reduce these impurities is essential not only to obtain a high-quality crystalline oxide semiconductor film, but also to obtain good characteristics of semiconductor elements formed with the oxide semiconductor film.

In the Non-Patent Document 1, it has been pointed out that an oxide semiconductor is insensitive to impurities, and there is no problem when a considerable amount of metal impurities are contained in the film; therefore, soda-lime glass which is inexpensive and contains a large amount of an alkali metal such as sodium can also be used. Such consideration, however, is not appropriate.

According to the findings obtained by the inventor, an alkali metal and an alkaline earth metal are adverse impurities for an oxide semiconductor layer and are preferably contained as few as possible. When an insulating film in contact with the oxide semiconductor layer is an oxide, an alkali metal, in particular, Na diffuses in the oxide and becomes Na$^+$.

In addition, Na cuts the bond between a metal and oxygen or enters the bond in the oxide semiconductor layer. As a result, transistor characteristics deteriorate (for example, the transistor becomes normally-on (the shift of a threshold voltage to a negative side) or the mobility is decreased). In addition, this also causes a variation in characteristics.

Such a problem is significant especially in the case where the concentration of hydrogen in the oxide semiconductor layer is sufficiently low. Therefore, the concentration of an alkali metal is strongly required to be set in the above-described range in the case where the concentration of hydrogen contained in the oxide semiconductor layer is lower than or equal to $1 \times 10^{18}$ cm$^{-3}$, particularly lower than or equal to $1 \times 10^{17}$ cm$^{-3}$. It is preferable that both the target and the crystalline oxide semiconductor film obtained fulfill the above-described condition.

It is known that it is difficult to obtain accurate data in the proximity of a surface of a sample or in the proximity of an interface between stacked films formed using different materials by SIMS in principle. Thus, in the case where distribution of the concentration of impurities in the films in the thickness direction is analyzed by SIMS, a minimum value in a region where an object is provided, the value is not greatly changed, and substantially the same strength can be obtained is employed as the concentration of impurities.

Further, in the case where the thickness of the object to be measured is small, that is, in the case where measurement is performed on a thin film, a region where substantially the same strength can be obtained cannot be found in some cases due to the influence of the concentration of impurities in the adjacent film. In that case, the minimum value of the concentration of impurities of a region where the film is provided is employed as the concentration of impurities in the film.

One embodiment of the present invention can provide a single crystal oxide semiconductor film or a substantially single crystal oxide semiconductor film with few defects. A transistor having good characteristics, high reliability and excellent electric stability can be manufactured using such an oxide semiconductor film. In addition, a variation in characteristics among elements can be reduced. This effect is especially significant in the case of a semiconductor element having a channel length or a channel width of less than or equal to 0.5 μm.

DETAILED DESCRIPTION OF THE INVENTION

Hereinafter, embodiments of the present invention will be described with reference to the drawings. However, the present invention is not limited to the description below, and it is easily understood by those skilled in the art that modes and details disclosed herein can be modified in various ways. Therefore, the present invention is not construed as being limited to description of the embodiments. The structures, the conditions, and the like disclosed in any of the following embodiments can be combined with those disclosed in other embodiments as appropriate.

Note that in the following embodiments, an example where the technical idea of the present invention is applied to a semiconductor device including a transistor is mainly given; however, it can be easily understood that the technical idea of the present invention is not limited to being applied to a transistor. Further, terms such as "gate", "source", and "drain" used in the embodiments are used for simple description and are not limited to the interpretation of the meanings of the terms.

For example, "a conductive region and a region incorporated therewith provided so as to get across a semiconductor region over an insulating film provided over the semiconductor region" is simply referred to as a "gate electrode" in this specification. Further, a source and a drain are not particularly distinguished in this specification. When one is referred to as a source, the other is referred to as a drain.

Further, in an oxide in this specification, the percentage (at. %) of oxygen contained in a substance (including a compound) is greater than or equal to 40% of the total.

A metal element in this specification refers to all elements other than a rare gas element, hydrogen, boron, carbon, nitrogen, a Group 16 element (e.g., oxygen), a Group 17 element (e.g., fluorine), silicon, phosphorus, germanium, arsenic, and antimony.

Further, in this specification, "one metal element is a main metal component" indicates the case where among a plurality of metal elements in a substance, the percentage of the metal element is greater than or equal to 50% of the total percentage of the metal elements. In addition, "n kinds of metal elements $M_1$, $M_2$, . . . , and $M_n$ are main metal components" indicates the case where the sum of percentages of the metal elements $M_1$, $M_2$, . . . , and $M_n$ is greater than or equal to $\{(1-2^{-n}) \times 100\}$ [%] of the total percentage of the metal elements.

Embodiment 1

Figure 1:
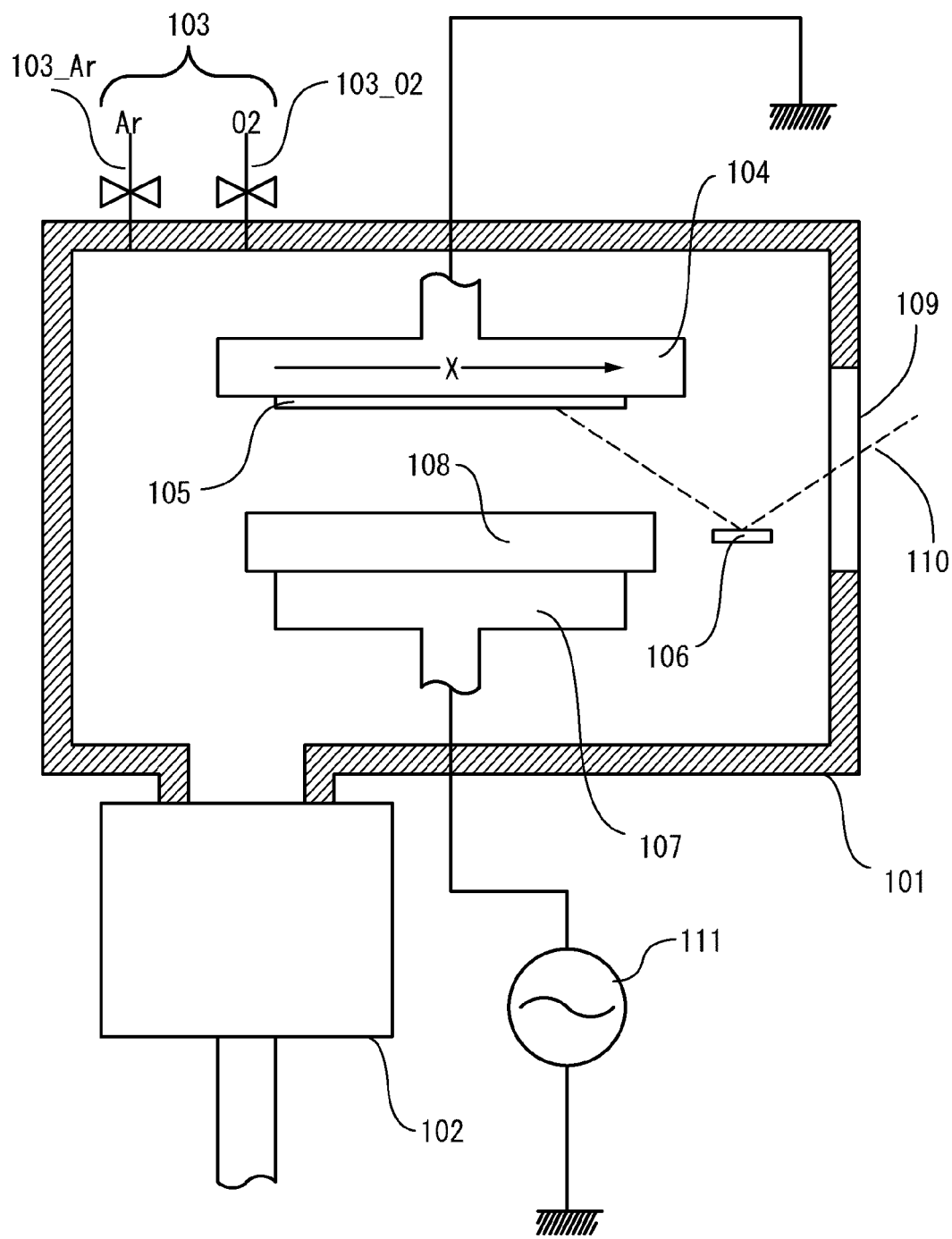
FIG. 1 is a schematic view of a film formation apparatus.

In this embodiment, an apparatus for forming an oxide semiconductor film with high crystallinity is described with reference to FIG. 1 and FIG. 2. In FIG. 1, an outline of a film formation apparatus described in this embodiment is illustrated. The oxide semiconductor film is formed by a sputtering method with the use of the film formation apparatus.

The film formation apparatus includes a film formation chamber 101, an exhaust system 102, a gas system 103 (including a line for argon 103_Ar and a line for oxygen 103_O$_2$ here), a substrate holder 104, an optical system 106, a target holder 107, a window 109, and a power source 111.

The exhaust system 102 includes a vacuum pump such as a turbo molecular pump, and the exhaust system 102 is used for evacuating the film formation chamber 101 to a vacuum level or keeping the pressure in the film formation chamber 101 at a pressure appropriate for film formation. In particular, the characteristics of an oxide semiconductor are significantly changed in the case where hydrogen atoms or hydrogen ions (protons) enter the oxide semiconductor, and thus, it is preferable that the exhaust system 102 with sufficient exhaust performance be used. An entrapment vacuum pump such as a cryopump, an ion pump, or a titanium sublimation pump, or a turbo molecular pump provided with a cold trap may be used.

From the film formation chamber which is evacuated with the above-described exhaust system, hydrogen molecules, a compound containing hydrogen atoms such as water ($H_2O$) (preferably, also a compound containing carbon atoms), and the like are removed. Accordingly, the concentration of impurities in an oxide semiconductor film which is formed by using the film formation chamber can be reduced. Accordingly, the crystallinity of the obtained oxide semiconductor film can be improved.

Further, it is preferable that counter flow from the exhaust system 102 be prevented. For a similar reason, it is also preferable that a leak rate of the film formation apparatus including the film formation chamber 101 be set to be less than or equal to $1 \times 10^{-10}$ Pa·m$^3$/seconds.

Furthermore, for a similar reason, it is desirable that as a gas used for the film formation, a high-purity gas (the purity thereof is greater than or equal to 99.9999% (6N), preferably, greater than or equal to 99.99999% (7N)) from which impurities including hydrogen such as hydrogen, water, a hydroxyl group, and hydride are sufficiently removed be used. It is expected that such a high-purity gas can be properly treated with the gas system 103. It is preferable to employ a system with which the air does not enter a pipe.

A substrate 105 is fixed on the substrate holder 104. It is preferable that the substrate holder 104 be provided with a heater or a cooling device so that the substrate temperature can be controlled to be constant. A target 108 is attached to the target holder 107. The target 108 may be an oxide sintered body including a metal element forming the oxide semiconductor, and, it is desirable that the concentration of the other metal elements (atomic ratio) is less than or equal to 100 ppm. Specifically, it is preferable that the concentration of an alkali metal and an alkali earth metal be less than or equal to 10 ppm of the entire target.

More specifically, the concentration of sodium, which is measured by SIMS is set to be less than or equal to $5 \times 10^{16}$ cm$^{-3}$, preferably less than or equal to $1 \times 10^{16}$ cm$^{-3}$, further preferably less than or equal to $1 \times 10^{15}$ cm$^{-3}$. Further, the concentration of lithium, which is measured by SIMS is set to be less than or equal to $5 \times 10^{15}$ cm$^{-3}$, preferably, less than or equal to $1 \times 10^{15}$ cm$^{-3}$. Furthermore, the concentration of potassium, which is measured by SIMS is set to be less than or equal to $5 \times 10^{15}$ cm$^{-3}$ preferably, less than or equal to $1 \times 10^{15}$ cm$^{-3}$.

Note that, according to the examination by the inventor, in the case where the substrate temperature is increased in film formation, the concentration of an alkali metal is reduced. This is because the vapor pressure of an alkali metal is higher than the vapor pressure of other metal elements forming the oxide semiconductor, and therefore, an alkali metal is vaporized in film formation. However, in this embodiment, as described later, the substrate temperature cannot be sufficiently high in some cases. In such a case, the concentration of an alkali metal cannot be reduced by the vaporization of an alkali metal as described above. Therefore, there are no effective methods other than the method by which the concentration of an alkali metal included in the target is sufficiently reduced.

In a similar way, by increasing the substrate temperature in film formation, the concentration of hydrogen included in a film can be reduced. However, in this embodiment, the substrate temperature cannot be sufficiently increased in some cases, and thus, the method in which the concentration of hydrogen included in the target can be sufficiently reduced is effective. The concentration of hydrogen (hydrogen atoms or hydrogen ions (protons)) in the target, which is measured by SIMS is less than or equal to $1 \times 10^{18}$ cm$^{-3}$, preferably, less than or equal to $1 \times 10^{17}$ cm$^{-3}$, further preferably, less than $1 \times 10^{16}$ cm$^{-3}$. Note that the concentration of hydrogen included in the film can be reduced by performing a heat treatment at higher temperature under an appropriate atmosphere after film formation.

The window 109 is provided not only for observing the reaction in the film formation chamber, but also for introducing laser light 110 into the film formation chamber. Therefore, the window 109 needs to be transparent with respect to the laser light that is used. Further, as the window is misted during film formation in some cases, the structure in which the deposit attached to the window can be removed after the film formation is preferable.

The optical system 106 is used for leading the laser light 110 which enters the film formation chamber to the substrate 105 appropriately. Since the deposit is also formed on the optical system 106 in film formation in some cases, the structure in which the deposit can be removed after the film formation is preferable.

The power source 111 is used for generating plasma over the surface of the target 108. Although an AC power source is used in FIG. 1, a DC power source may also be used. Further, in the case of using a high-frequency power source such as an RF power source, a matching box or the like may be provided so that power is led to the film formation chamber effectively.

Figure 2:
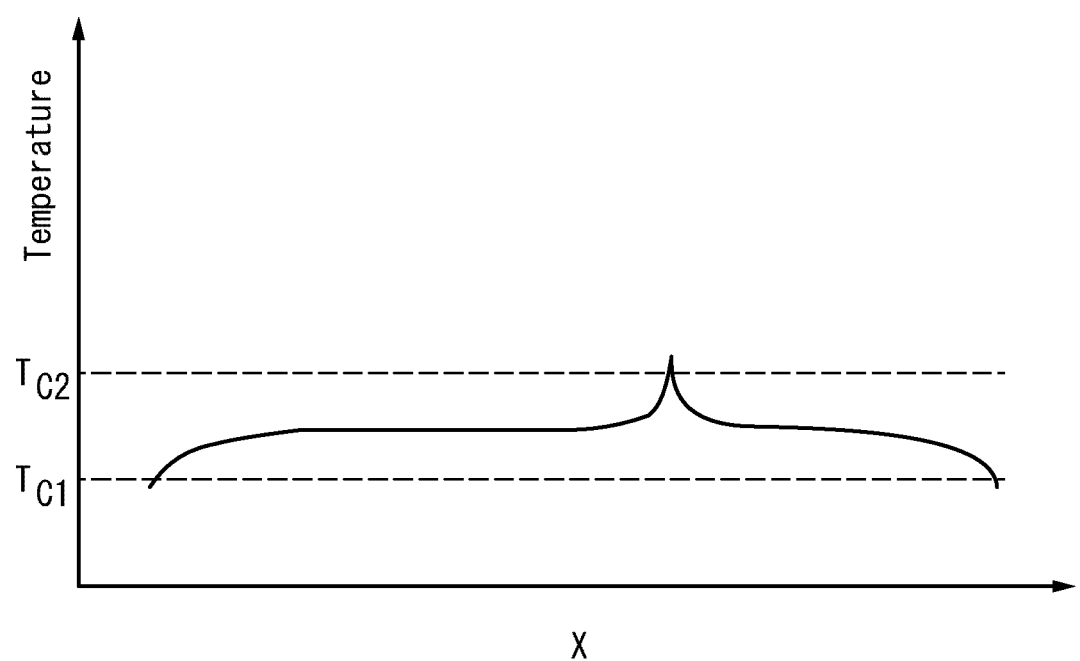
FIG. 2 is a schematic view of temperature distribution in a substrate.

FIG. 2 schematically shows a temperature distribution of the substrate 105 in film formation. The temperature of the substrate 105 represented by an arrow X in FIG. 1 is higher than or equal to a first temperature $T_{C1}$ and lower than a second temperature $T_{C2}$ in the most part of the substrate. Here, the first temperature $T_{C1}$ is the temperature at which crystallization occurs with some stimulation, and the second temperature $T_{C2}$ is the temperature at which crystallization occurs spontaneously without any stimulation.

Therefore, in the temperature range of higher than or equal to the first temperature $T_{C1}$ and lower than the second temperature $T_{C2}$, spontaneous crystal growth does not occur, but crystallization occurs with some stimulation from outside. For example, crystallization occurs by the influence of crystallization of the adjacent part.

Further, the temperature of an area which is close to a region irradiated with laser light is higher than or equal to $T_{C2}$. The size (typical length) of the region in which the temperature is higher than or equal to $T_{C2}$ may be greater than or equal to 1 nm and less than or equal to 1 μm; however, the appropriate value varies depending on the oxide semiconductor formed. In the case where the region is too large, a plurality of crystals is grown independently in the region. Accordingly, the obtained oxide semiconductor film is affected by the independent crystal growths, and the film whose crystal orientation is not uniform is formed. In the case where the area where the temperature is higher than or equal to $T_{C2}$ is sufficiently small, one crystal can be grown in the area. Thus, the obtained oxide semiconductor film is a single crystal film or a substantially single crystal film whose crystal orientation is uniform.

The temperature $T_{C1}$ and the temperature $T_{C2}$ vary depending on the oxide semiconductor formed, and thus, the substrate needs to be heated or cooled depending on the oxide semiconductor formed. Further, the intensity of the laser light needs to be appropriate intensity. In some cases, the temperature is raised because of plasma in film formation. Thus, it is preferable that the temperature be set in consideration of the influence of plasma.

As is seen from the above description, the temperature of the most part of the substrate is higher than or equal to $T_{C1}$ and lower than $T_{C2}$. For example, the $T_{C1}$ in the case of an In—Ga—Zn-based oxide is lower than or equal to 150° C., and the $T_{C2}$ in the case of the In—Ga—Zn-based oxide is about 250° C. Accordingly, a crystalline oxide semiconductor film can be obtained at relatively low temperature. In other words, a material whose heat resistance is not high enough can be used as the substrate.

An oxide semiconductor film with sufficient crystallinity can be deposited at the early stage of the film formation. Accordingly, the oxide semiconductor film with high crystallinity can be formed without irradiation with laser light after the film formation. For example, in the case of forming an oxide semiconductor film having a thickness of 20 nm, only 5 nm of the oxide semiconductor film is formed while irradiation with laser light is performed, and after that, the irradiation with laser light may be stopped.

In this embodiment, an example of the method in which laser light is used to heat the substrate locally is described. Heating the substrate locally can also be performed by using an electron beam. The diameter of an electron beam can be much smaller than the diameter of laser light, and thus, the electron beam is preferable to obtain a high-quality crystalline oxide semiconductor film. Further, a minute heater may be used. For example, local heating may be performed with a minute structure which is used as a probe of a scanning tunneling microscope or the like.

Note that a method of forming the oxide semiconductor film is not limited to a sputtering method, and a vacuum evaporation method, an atomic layer deposition method or the like may be used.

Embodiment 2

In this embodiment, an example of manufacturing a display device including a transistor with the use of an oxide semiconductor formed using the above-described film formation device is described. FIGS. 3A to 3E are cross-sectional views illustrating a process of manufacturing the display device of this embodiment. The transistor described in this embodiment has a top-gate structure in which a gate electrode is located on the side of a semiconductor layer which is opposite to the substrate, and a top-contact structure in which a source electrode and a drain electrode are in contact with a top surface of a semiconductor layer.

Figure 3A:
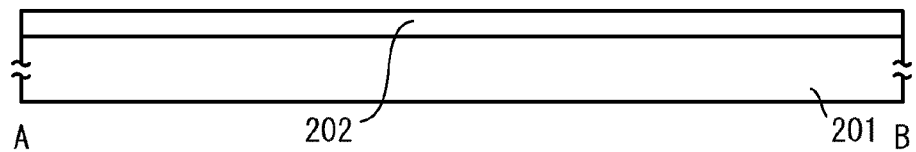
FIGS. 3A to 3E are cross-sectional views illustrating a manufacturing process of a display device.
Figure 3B:
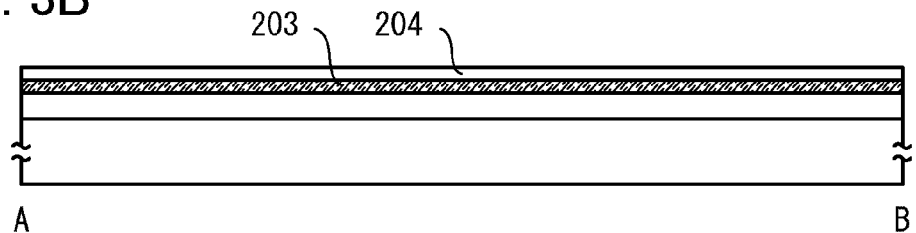
Figure 3C:
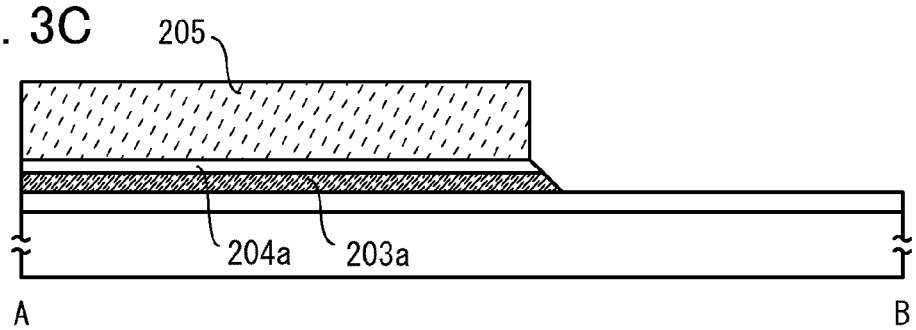

The outline of a manufacturing process will be described below. As illustrated in FIG. 3A, a base insulating film 202 is formed over a substrate 201 having an insulating surface.

There is no particular limitation on a substrate which can be used for the substrate 201; however, the substrate needs to have an insulating surface. For example, a glass substrate such as a barium borosilicate glass substrate or an aluminoborosilicate glass substrate may be used. Further, in addition to this, an insulator such as quartz or sapphire, or a semiconductor having a high insulating property such as silicon carbide may be used. Furthermore, a substrate obtained by forming an insulating film on a surface of a semiconductor whose insulating property is not so high such as silicon, germanium, or gallium arsenide, a surface of a semiconductor whose conductivity is increased by doping, or a surface of metal such as copper or aluminum may be used.

The base insulating film 202 is a multilayer or a single layer. It is preferable to use, in the top layer, an oxide film with a thickness of greater than or equal to 300 nm in which the concentration of hydrogen is less than or equal to $1\times10^{19}$ $cm^{-3}$, preferably, less than or equal to $1\times10^{18}$ $cm^{-3}$, and which is formed by a sputtering method so as to contain excess oxygen. Further, in the case where impurities unfavorable for a transistor are included in the substrate, it is desirable that a film formed of an insulating material (e.g., aluminum nitride, aluminum oxide, or silicon nitride) having a function of blocking the impurities be provided in a lower layer.

It is preferable that a surface of the base insulating film 202 be a sufficiently flat surface, and a foreign substance be not attached to the surface. In terms of the flatness (the surface roughness), a value of the root-mean-square (RMS) may be set to be less than or equal to 1 nm, preferably, less than or equal to 0.3 nm, further preferably, less than or equal to 0.1 nm. These conditions are effective when an oxide semiconductor film with excellent crystallinity is formed. In order to obtain such a flat surface, a surface of the substrate 201 or the base insulating film 202 may be sufficiently polished so that the surface of the substrate 201 or the base insulating film 202 is sufficiently flat.

Next, a crystalline oxide semiconductor film 203 is formed by the method described in Embodiment 1. An oxide semiconductor for forming the crystalline oxide semiconductor film 203 preferably contains at least indium (In) or zinc (Zn). In particular, both In and Zn are preferably contained. It is preferable that gallium (Ga) be additionally contained as a stabilizer for reducing a variation in electric characteristics of a transistor using the above oxide. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, indium oxide, tin oxide, zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Here, indium oxide means an oxide containing indium as a main metal element (that is, the percentage of indium is greater than or equal to 50% of the total metal elements), and metal elements other than indium may also be contained. Similarly, an In—Sn—Ga—Zn-based oxide means an oxide containing indium, tin, gallium and zinc as main metal elements (that is, the percentage of these four metal elements is greater than or equal to 93.8% of the total metal elements). Note that there is no limitation on the ratio of indium, tin, gallium, and zinc. Metal elements other than indium, tin, gallium, and zinc may also be contained.

Further, a material represented by $InMO_3(ZnO)_m$ (m>0, and m is not an integer) may be used as an oxide semiconductor. Note that M represents one or more metal elements selected from Ga, Fe, Mn, and Co. Alternatively, as the oxide semiconductor, a material represented by $In_2SnO_5(ZnO)_n$ (n>0, and n is an integer) may be used.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions may be used.

Further, in the case where an In—Zn—O-based material is used as an oxide semiconductor, a target used has a composition ratio of In:Zn=50:1 to 1:2 in an atomic ratio, preferably, In:Zn=20:1 to 1:1 in an atomic ratio, further preferably, In:Zn=15:1 to 1.5:1 in an atomic ratio. Furthermore, in the case where the atomic ratio is In:Zn:O=1:1:X, X>1, preferably, X>1.5 is satisfied.

However, the composition is not limited to those described above, and a material having an appropriate composition may be used, depending on necessary semiconductor characteristics (e.g., mobility, a threshold voltage, and a variation). In order to obtain necessary semiconductor characteristics, it is preferable that the concentration of carriers, the concentration of impurities, the defect density, the atomic ratio of metal elements to oxygen, the interatomic distance, the density, or the like be set appropriately.

For example, with an In—Sn—Zn-based oxide, high mobility can be obtained relatively easily. However, even with an In—Ga—Zn-based oxide, mobility can be increased by reducing the defect density in the bulk.

Note that in the case where the composition of an oxide having an atomic ratio of In:Ga:Zn=a:b:c (a+b+c=1) is in the neighborhood of the composition of an oxide having an atomic ratio of In:Ga:Zn=A:B:C (A+B+C=1), a, b, and c satisfy the following relation: $(a-A)^2+(b-B)^2+(c-C)^2 \le r^2$, and r may be 0.05, for example. The same applies to other oxides.

In this embodiment, an oxide semiconductor film having a thickness of greater than or equal to 1 nm and less than or equal to 30 nm is formed using an In—Ga—Zn-based oxide target (In:Ga:Zn=1:1:1 [atomic ratio]). The filling rate of the target is greater than or equal to 90% and less than or equal to 100%, preferably, greater than or equal to 95% and less than or equal to 99%. By using the target which has a high filling rate, the obtained crystalline oxide semiconductor film 203 can be a film with excellent crystallinity.

In order to prevent the crystalline oxide semiconductor film 203 from being exposed to the air or an organic substance such as a resist formed in the later step, a barrier film 204 formed of silicon oxide or the like having a thickness of 10 nm to 50 nm is provided over the crystalline oxide semiconductor film 203, for example. It is preferable that the barrier film 204 be formed successively after forming the crystalline oxide semiconductor film 203 without exposure of the surface of the crystalline oxide semiconductor film 203 to the air.

Next, after the formation of the barrier film 204, heat treatment is performed in a nitrogen atmosphere or a dry air atmosphere. The heat treatment is performed at a temperature of higher than or equal to 200° C. and lower than or equal to 450° C., preferably, higher than or equal to 250° C. and lower than or equal to 380° C. The time for the heat treatment is preferably longer than or equal to 1 minute and shorter than or equal to 24 hours.

The heat treatment has an effect of removing hydrogen, water or the like included in the crystalline oxide semiconductor film 203 or the barrier film 204. The heat treatment can be performed not only at the above-described timing but also at any timing after the crystalline oxide semiconductor film 203 is formed. In addition, similar dehydration treatment or dehydrogenation treatment may be performed once or plural times.

The heat treatment can be performed in such a manner that, for example, an object is introduced into an electric furnace in which a resistance heating element or the like is used and heated under a nitrogen atmosphere. During the heat treatment, the exposure of the surface of the crystalline oxide semiconductor film 203 to the air and the entry of water or hydrogen into the crystalline oxide semiconductor film 203 are prevented.

An apparatus used for this heat treatment is not limited to the electric furnace and may be an apparatus for heating an object by thermal conduction or thermal radiation from a medium such as a heated gas. For example, a rapid thermal anneal (RTA) apparatus such as a gas rapid thermal anneal (GRTA) apparatus or a lamp rapid thermal anneal (LRTA) apparatus can be used.

An LRTA apparatus is an apparatus for heating an object by radiation with light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas which does not react with an object by heat treatment, such as nitrogen or a rare gas such as argon is used.

For example, as the heat treatment, the GRTA process may be performed as follows. The object is put in a heated inert gas atmosphere, heated for several minutes, and taken out of the inert gas atmosphere. The GRTA process enables high-temperature heat treatment for a short time. Moreover, the GRTA process can be employed even when the temperature condition exceeds the upper temperature limit of the object.

Note that as the inert gas atmosphere, it is desirable that an atmosphere that contains nitrogen or a rare gas (e.g., helium, neon, or argon) as its main component and does not contain water, hydrogen, or the like be used. For example, the purity of nitrogen or a rare gas such as helium, neon, or argon introduced into a heat treatment apparatus is greater than or equal to 6 N (99.9999%), preferably, greater than or equal to 7 N (99.99999%) (that is, the concentration of the impurities is lower than or equal to 1 ppm, preferably, lower than or equal to 0.1 ppm).

Further, the inert gas may be switched to a gas containing oxygen during the process. This is because defect levels in the energy gap due to oxygen deficiency can be reduced by performing the heat treatment in an atmosphere containing oxygen.

By the heat treatment, the impurities included in the crystalline oxide semiconductor film 203 can be reduced. In addition to this, oxygen is supplied from the base insulating film 202 to the crystalline oxide semiconductor film 203; therefore the crystalline oxide semiconductor film 203 can be intrinsic or substantially intrinsic. That is, the concentration of carriers derived from a donor can be lower than $1 \times 10^{14}$ cm$^{-3}$, preferably, lower than $1 \times 10^{12}$ cm$^{-3}$, and further preferably, lower than $1 \times 10^{11}$ cm$^{-3}$.

Next, an island-shape crystalline oxide semiconductor layer 203a is formed by processing the crystalline oxide semiconductor film 203. At that time, the barrier film 204 is also etched, and becomes a barrier layer 204a. The barrier layer 204a and the crystalline oxide semiconductor layer 203a are formed by selectively etching the barrier film 204 and the crystalline oxide semiconductor film 203 after a mask 205 which is formed of a resist and has a desired shape is formed over the barrier film 204. The mask 205 can be formed by a method such as photolithography. Alternatively, the mask 205 may be formed by a method such as an ink-jet method (see FIG. 3C).

For the etching of the crystalline oxide semiconductor film 203, either dry etching or wet etching may be employed. It is needless to say that both of them may be employed in combination. The mask 205 is removed after the etching. Further, the barrier layer 204a is removed by dry etching or the like.

After the barrier layer 204a is removed, an oxide film exhibiting n-type conductivity and a conductive film such as a metal film are deposited without exposure of the surface of the crystalline oxide semiconductor layer 203a to the air. That is, it is preferable that an apparatus for etching the barrier film 204a and an apparatus for forming the above-described oxide film exhibiting n-type conductivity and the conductive film such as a metal film be connected to each other, and processes can be performed successively without the substrate being taken out to the outside of the apparatuses. In order to form these films, a sputtering method may be used.

As the n-type oxide film, indium oxide, zinc oxide, an In—Sn-based oxide, an Al—Zn-based oxide or the like may be used. Note that the n-type oxide film is provided for reducing contact resistance between the crystalline oxide semiconductor layer 203a and a source and drain electrodes which are formed over the n-type oxide film; however, the n-type oxide film is not necessarily provided depending on the kind of metal to be used for the source electrode and the drain electrode.

As the conductive film, for example, a metal film containing an element selected from aluminum, chromium, copper, tantalum, titanium, molybdenum, and tungsten, a metal nitride film containing any of the above elements as a main metal component (e.g., a titanium nitride film, a molybdenum nitride film, or a tungsten nitride film) or the like can be used.

Alternatively, a film of a high-melting-point metal such as titanium, molybdenum, or tungsten, or a metal nitride film thereof (e.g., a titanium nitride film, a molybdenum nitride film, or a tungsten nitride film) may be formed over and/or below a metal film such as an Al film or a Cu film.

Figure 3D:
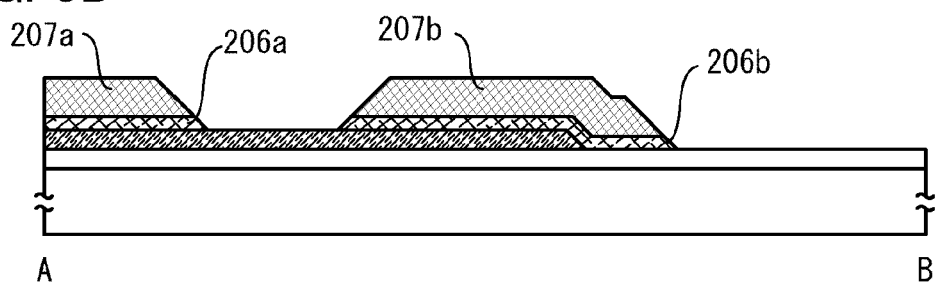
Figure 3E:
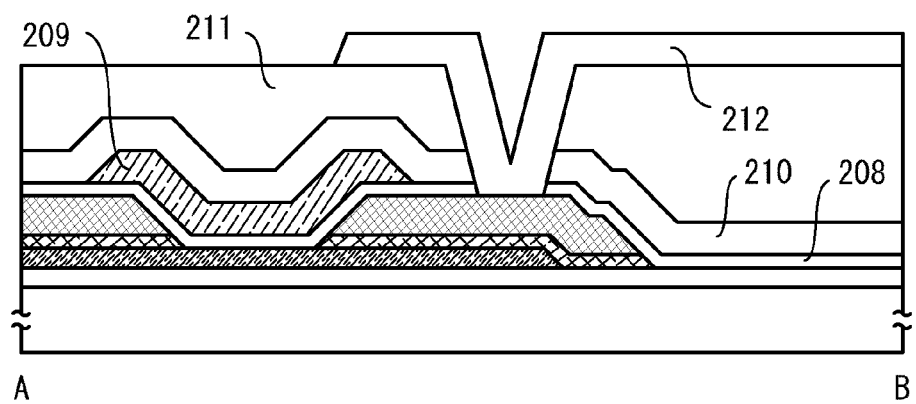

Then, by processing these films into a desired shape, an n-type oxide layer 206a, an n-type oxide layer 206b, a source electrode 207a, and a drain electrode 207b are formed (see FIG. 3D). Note that at the time when the conductive film is etched, in some cases, a part of the crystalline oxide semiconductor layer 203a is also etched, and thereby a groove (a depression portion) is formed in the crystalline oxide semiconductor layer 203a.

After the above-described etching, a gate insulating film 208 is formed without exposure of the surface of the crystalline oxide semiconductor layer 203a to the air. In other words, it is preferable that an apparatus for etching the conductive film and the n-type oxide film and an apparatus for forming the gate insulating film 208 be connected to each other, and processes can be performed successively without the substrate being taken out to the outside of the apparatuses. The gate insulating film 208 may be formed using silicon oxide, silicon oxynitride, silicon nitride, aluminum oxide, hafnium oxide, yttrium oxide or the like by a known sputtering method, a known CVD method, or the like.

The thickness of the gate insulating film 208 may be 10 nm to 200 nm. Note that the optimum thickness of the gate insulating film is determined as appropriate by voltage applied to a gate electrode or the like. In general, in the case where the applied voltage is low, the gate insulating film is set to be thin, whereas in the case where the applied voltage is high, the gate insulating film is set to be thick.

Moreover, a gate electrode 209 is formed. The gate electrode 209 can be a single layer or a stacked layer using a metal element such as molybdenum, titanium, chromium, tantalum, tungsten, aluminum, or copper, or an alloy material which includes any of these elements as a main metal element. Because the threshold value or the like of the obtained transistor is changed by a work function of a material used for the gate electrode 209, selection of a material in accordance with the required threshold value is needed. In the above manner, a basic structure of a transistor is completed.

Further, a first interlayer insulator 210 is formed by a sputtering method, a CVD method, or the like. The first interlayer insulator 210 can be formed typically using an inorganic insulator such as silicon oxide, silicon oxynitride, aluminum oxide, or aluminum oxynitride. In particular, a material that does not transmit hydrogen atoms or hydrogen ions is preferable.

After the first interlayer insulator 210 is formed, a second interlayer insulator 211 having a flat surface is formed. The second interlayer insulator 211 may be formed using any of various organic materials. Then, the gate insulating film 208, the first interlayer insulator 210, and the second interlayer insulator 211 are selectively etched, so that a contact hole reaching the drain electrode 207b is formed. A display electrode 212 which is in contact with the drain electrode 207b through this contact hole is formed (see FIG. 3E).

A light-transmitting electrode or a reflective electrode can be used for the display electrode 212. As the light-transmitting electrode, a conductive material whose band gap is greater than or equal to 3 eV such as an In—Sn-based oxide or an Al—Zn-based oxide can be used. A metal nanowire or a carbon film (e.g., graphene) whose thickness is less than or equal to 3 nm can also be used. As the reflective electrode, a film formed using any of various metal materials (e.g., aluminum or silver) can be used. The surface of the reflective electrode is preferably provided with irregular unevenness to display white color.

Figure 5A:
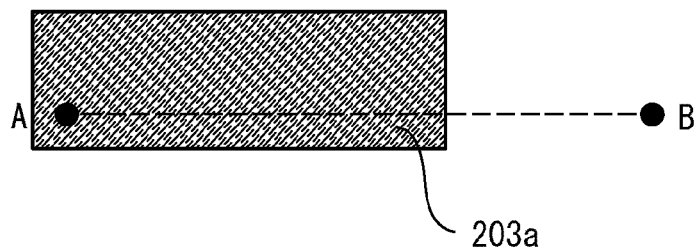
FIGS. 5A to 5C are views illustrating a manufacturing process of a display device.
Figure 5B:
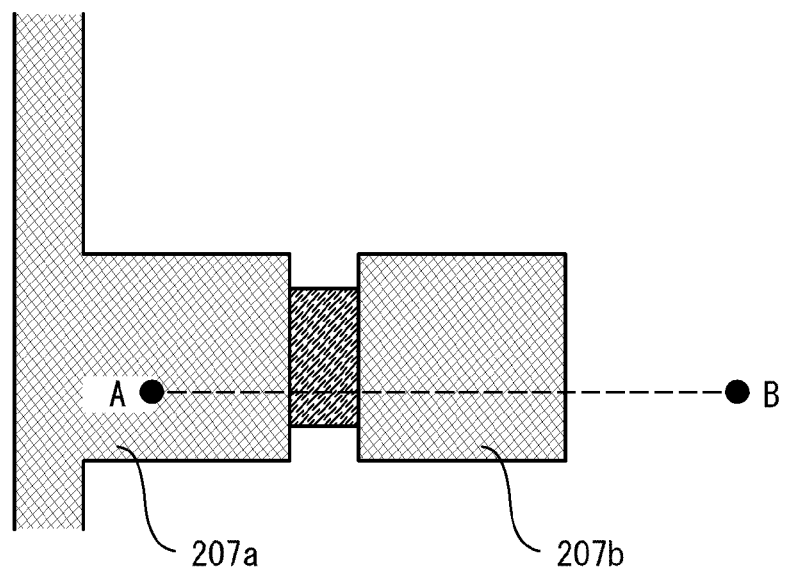
Figure 5C:
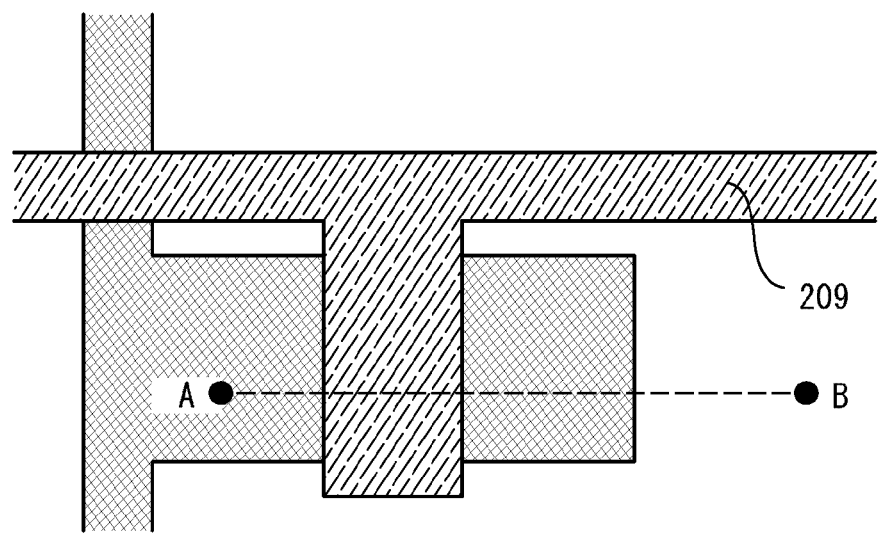

FIGS. 5A to 5C illustrate the above-described manufacturing process which is seen from above. A cross section taken along a dashed line connecting a point A and a point B corresponds to FIGS. 3A to 3F. The barrier film 204, the gate insulating film 208, and the like are not shown in FIGS. 5A to 5C. FIG. 5A corresponds to FIG. 3C. FIG. 5B corresponds to FIG. 3D. In addition, FIG. 5C illustrates an intermediate state between the step illustrated in FIG. 3D and the step illustrated in FIG. 3E. In other words, FIG. 5C illustrates a state just after the gate electrode 209 is formed after the step illustrated in FIG. 3D.

Embodiment 3

Figure 4A:
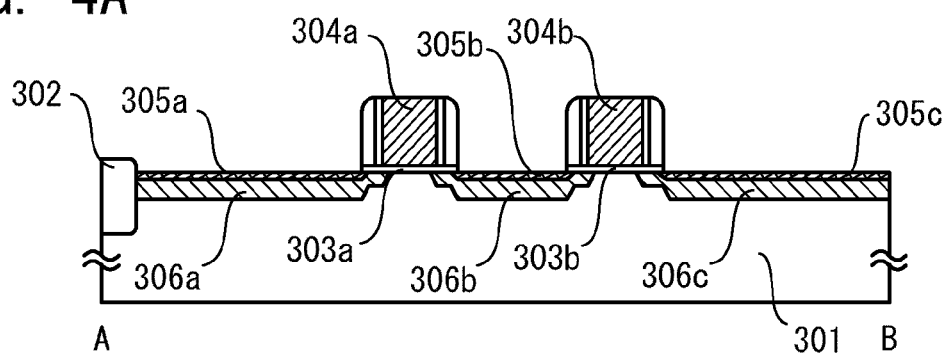
FIGS. 4A to 4C are cross-sectional views illustrating a manufacturing process of a hybrid type semiconductor device.
Figure 4B:
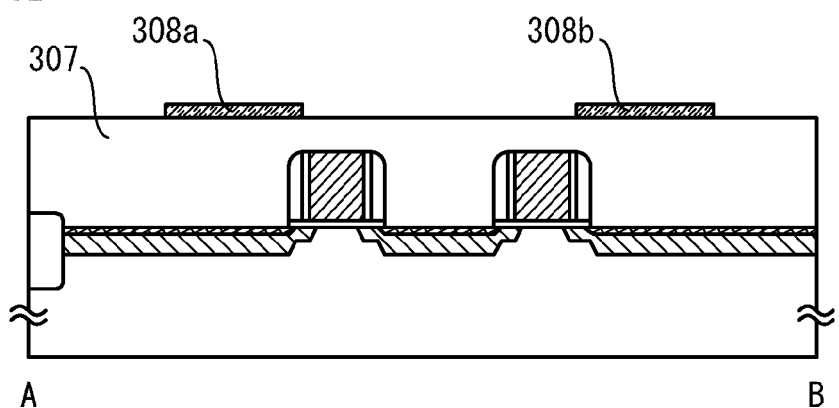
Figure 4C:
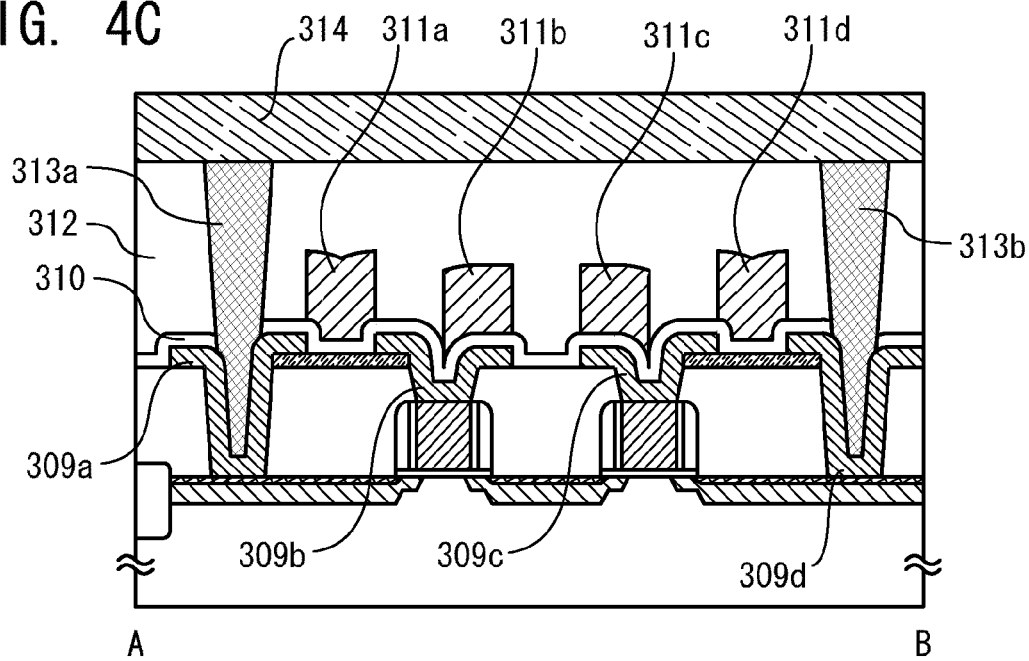
Figure 6A:
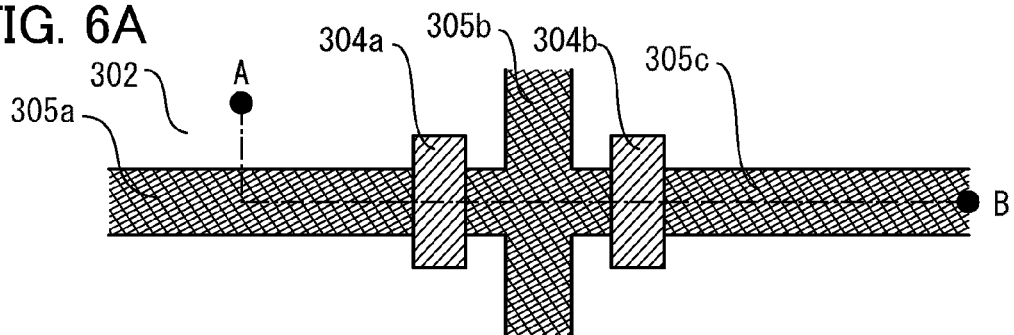
FIGS. 6A to 6D are views illustrating a manufacturing process of a hybrid type semiconductor device and a circuit thereof.
Figure 6B:
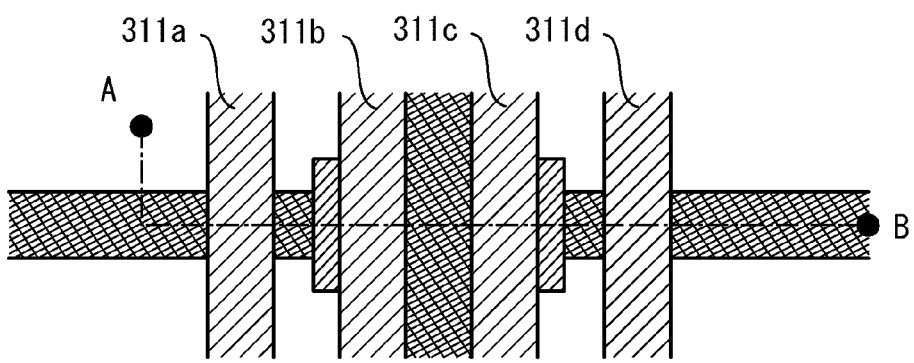
Figure 6C:
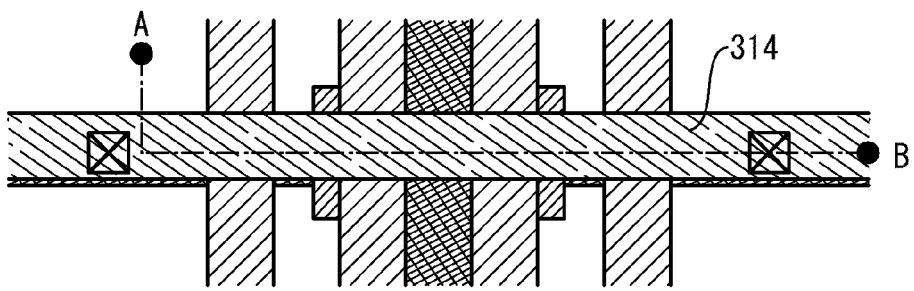

This embodiment will be described with reference to FIGS. 4A to 4C and FIGS. 6A to 6D. FIGS. 6A to 6C are top views, and FIGS. 4A to 4C are cross-sectional views corresponding to FIGS. 6A to 6C. FIGS. 4A to 4C are cross-sectional views taken along dot-dashed line A-B in FIGS. 6A to 6C. This embodiment shows an example of a hybrid type semiconductor device in which a semiconductor circuit using an oxide semiconductor is formed over a semiconductor circuit formed using a single crystal semiconductor substrate.

Figure 6D:
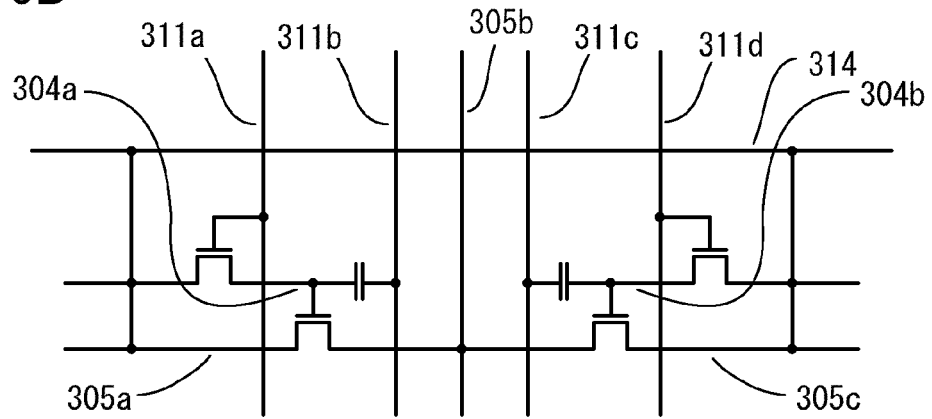

The semiconductor device formed in this embodiment is a semiconductor memory device whose circuit diagram is illustrated in FIG. 6D. Two memory elements are illustrated on the left and the right in FIG. 6D. The memory elements each include a first transistor including an oxide semiconductor, a second transistor including a single crystal semiconductor, and a capacitor. A source of the first transistor and a gate of the second transistor (304a and 304b) are connected to an electrode of the capacitor.

A write word line 311a and a write word line 311d are connected to the gates of the first transistors of the memory elements on the left and the right. Further, a read word line 311b and a read word line 311c are connected to other electrodes of the capacitors of the memory elements on the left and the right. A bit line 314 is connected to the drains of the first transistors and the drains of the second transistors of the memory elements on the left and the right. A source line 315 is connected to the sources of the second transistors of the memory elements on the left and the right.

At the time of writing of data, the first transistor is turned on by applying a row selection signal to the write word line while a potential of the bit line is set to be a potential in accordance with data to be written. Accordingly, electric charge is accumulated in the capacitor. After writing of data, the potential of the write word line is controlled so that the first transistor is turned off. As a result, the gate of the second transistor is in a floating state.

At the time of reading of data, the potential of the gate of the second transistor is controlled through the capacitor by applying a row selection signal to the read word line, so that the second transistor is turned on or turned off in accordance with the potential. Accordingly, reading of data can be performed by detecting the change with the potential of the bit line.

As is seen from the above description, electric charge does not flow out of the capacitor in reading of data in the memory element having this structure. Accordingly, data can be stored for an extremely long period by reducing leakage current from the capacitor as much as possible. For example, in the case where capacitance of the capacitor is set to $1 \times 10^{-17}$ F and the resistance between the source and the drain of the first transistor during non selection is set to $1 \times 10^{26} \Omega$, if there are no other causes of the leakage of electric charge, 73% of the total electric charge of the capacitor is held even after ten years.

As described in Embodiment 2, the concentration of carriers in the oxide semiconductor can be sufficiently reduced, so that the resistance between the source and the drain during non selection can be high as described above. In contrast, since a semiconductor memory device is required to be reduced in size, both the channel length and the channel width are less than or equal to 500 nm, typically, less than or equal to 100 nm. In such a minute semiconductor element, the crystallinity of the oxide semiconductor is required to be sufficiently high so that a variation in characteristics of the semiconductor is reduced.

A single crystal semiconductor element and semiconductor circuit may be formed by a known technique. As shown in FIG. 4A, an element separation insulator 302 is formed on a single crystal substrate 301 of silicon or the like. A drain 306a and a drain 306c of the second transistors, a source 306b of the second transistors, a gate insulating film 303a and a gate insulating film 303b of the second transistors, and the gates 304a and 304b of the second transistors are formed. Side walls may be provided on the side surfaces of the gates 304a and 304b of the second transistors. Further, silicide layers 305a, 305b and 305c may be provided on the surfaces of the drains 306a and 306c, and the surface of the source 306b of the second transistors so that the conductivity can be increased. Among them, the silicide layer 305b also functions as the above-described source line 315. Note that hydrogenation treatment may be performed after this.

FIG. 6A illustrates a state of the semiconductor device in FIG. 4A which is seen from above. Note that the side walls on the side surface of the gates 304a and 304b of the second transistors are omitted.

Then, a first interlayer insulator 307 having a single layer or multilayer structure is formed. It is preferable that the surface of the first interlayer insulator 307 be sufficiently flat, and the RMS of the surface roughness be set to be less than or equal to 1 nm, preferably, less than or equal to 0.3 nm, further preferably, less than or equal to 0.1 nm. For that purpose, it is desirable that treatment such as a CMP method be performed. Further, a region in contact with the single crystal semiconductor elements and semiconductor circuit in the first interlayer insulator 307 may be formed with an insulating film of silicon nitride or the like containing hydrogen at greater than or equal to 10%, and the thickness of the first interlayer insulator 307 may be greater than or equal to 50 nm. Moreover, the top layer of the first interlayer insulator 307 may be formed with silicon oxide whose hydrogen concentration is less than or equal to $1 \times 10^{18}$ cm$^{-3}$, in particular, less than or equal to $1 \times 10^{17}$ cm$^{-3}$, and the thickness of the top layer may be greater than or equal to 300 nm.

After that, a single crystal oxide semiconductor film is formed by the method described in Embodiment 1. In this embodiment, an In—Ga—Zn-based oxide semiconductor film having a thickness of 3 nm to 10 nm is formed. An oxide semiconductor layer 308a and an oxide semiconductor layer 308b are formed by etching the single crystal oxide semiconductor film into a desired shape (see FIG. 4B). After that, heat treatment such as the treatment described in Embodiment 2 is performed.

Further, contact holes reaching the silicide layer 305a, the silicide layer 305c, the gate 304a of the second transistor, and the gate 304b of the second transistor are formed in the first interlayer insulator 307. A conductive film is formed, and a first connecting electrode 309a, a first connecting electrode 309b, a first connecting electrode 309c, and a first connecting electrode 309d are formed by etching the conductive film. The connecting electrodes 309a and 309d serve as the drain electrodes of the first transistors and the second transistors of the memory elements. Further, the first connecting electrodes 309b and 309c serve as the source electrodes of the first transistors of the memory elements.

Then, a gate insulating film 310 of the first transistors is formed. The gate insulating film 310 of the first transistor is formed using silicon oxide, silicon oxynitride, silicon nitride, aluminum oxide, hafnium oxide, yttrium oxide or the like by a known sputtering method, a known CVD method, or the like. Further, the thickness of the gate insulating film 310 of the first transistor may be 10 nm to 20 nm.

After that, the write word lines 311a and 311d, and the read word lines 311b and 311c are formed using a conductive material. The write word lines 311a and 311d also serve as the gate electrodes of the first transistors of the memory cells, and may be formed using a material having a work function appropriate for the purpose. In order to increase the resistance between the source and the drain of the first transistor during non selection, a material having a high work function may be used.

FIG. 6B illustrates a state in which the write word lines 311a and 311d, and the read word lines 311b and 311c which are seen from above. Note that the first connecting electrodes 309a, 309b, 309c, and 309d, the gate insulating film 310 of the first transistor and the like are omitted.

After that, a second interlayer insulator 312 having a flat surface is formed. After contact holes reaching the first connecting electrodes 309a and 309d are formed by etching the second interlayer insulator 312 and the gate insulating film 310 of the first transistor, a second connecting electrode 313a and a second connecting electrode 313b are embedded in the contact holes. A known semiconductor technique may be used for this step. Further, the bit line 314 in contact with the second connecting electrodes 313a and 313b is formed using a conductive material (see FIG. 4C).

FIG. 6C illustrates a state of the semiconductor device in FIG. 4C which is seen from above. Note that the second interlayer insulator 312 and the like are omitted. In this embodiment, the maximum process temperature after the single crystal semiconductor elements are formed can be lower than or equal to 380° C. A diffusion technique of a donor or an acceptor is used to form a single crystal semiconductor element. This is because if treatment is performed at high temperature, a donor or an acceptor diffuses again. This is a significant problem for a minute semiconductor element having a channel length of less than or equal to 0.1 μm. In this respect, a method described in this embodiment has an advantage that treatment can be performed at the temperature at which a donor or an acceptor does not diffuse again.

Embodiment 4

The display device disclosed in Embodiment 2 or the semiconductor device disclosed in Embodiment 3 can be applied to a variety of electronic devices (including an amusement machine). Examples of the electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like.

This application is based on Japanese Patent Application serial no. 2010-204199 filed with Japan Patent Office on Sep. 13, 2010, the entire contents of which are hereby incorporated by reference.

What is claimed is:

1. A method of forming a crystalline oxide semiconductor film, comprising:
depositing a crystalline film comprising an oxide semiconductor by a sputtering method with a condition that a substrate is heated to a temperature of higher than or equal to a first temperature and lower than a second temperature and is irradiated with an energy line so that a temperature of a part of the substrate is higher than or equal to the second temperature,
wherein the crystalline film comprising the oxide semiconductor comprises a first portion which is crystalline,
wherein the crystalline film comprising the oxide semiconductor comprises a second portion over the part of the substrate,
wherein the first portion includes the second portion,
wherein an area of the first portion is larger than an area of the second portion,
wherein the first portion is a place where the substrate is heated in the depositing step,
wherein the second portion is a place where the substrate is irradiated with the energy line in the depositing step,
wherein the first temperature is a temperature at which crystallization of the oxide semiconductor occurs with a stimulation,
wherein the second temperature is a temperature at which crystallization of the oxide semiconductor occurs spontaneously,
wherein the part of the substrate has a typical length of 1 nm to 1 μm, and
wherein the typical length is a square root of a value obtained by dividing an area of the part by a circular constant.

2. The method of forming a crystalline oxide semiconductor film according to claim 1, wherein the energy line is laser light.

3. The method of forming a crystalline oxide semiconductor film according to claim 1, wherein the oxide semiconductor contains indium and zinc as main metal elements.

4. The method of forming a crystalline oxide semiconductor film according to claim 1, wherein the oxide semiconductor contains indium, gallium and zinc as main metal elements.

5. The method of forming a crystalline oxide semiconductor film according to claim 1, wherein the crystalline oxide semiconductor film is a single crystal oxide semiconductor film.

6. The method of forming a crystalline oxide semiconductor film according to claim 1, wherein the first temperature is lower than or equal to 150° C.

7. The method of forming a crystalline oxide semiconductor film according to claim 1, wherein the second temperature is higher than or equal to 250° C.

8. A method of forming a crystalline oxide semiconductor film, comprising:
depositing a crystalline film comprising an oxide semiconductor on a substrate with a condition that the substrate is heated to a temperature of higher than or equal to a first temperature and lower than a second temperature and is irradiated with an energy line so that a temperature of a part of the substrate is higher than or equal to the second temperature,
wherein the crystalline film comprising the oxide semiconductor comprises a first portion which is crystalline,
wherein the crystalline film comprising the oxide semiconductor comprises a second portion over the part of the substrate,
wherein the first portion includes the second portion,
wherein an area of the first portion is larger than an area of the second portion,
wherein the first portion is a place where the substrate is heated in the depositing step,
wherein the second portion is a place where the substrate is irradiated with the energy line in the depositing step,
wherein the first temperature is a temperature at which crystallization of the oxide semiconductor occurs with a stimulation,
wherein the second temperature is a temperature at which crystallization of the oxide semiconductor occurs spontaneously,
wherein the part of the substrate has a typical length of 1 nm to 1 μm, and wherein the typical length is a square root of a value obtained by dividing an area of the part by a circular constant.

9. The method of forming a crystalline oxide semiconductor film according to claim 8, wherein the oxide semiconductor contains indium and zinc as main metal elements.

10. The method of forming a crystalline oxide semiconductor film according to claim 9, wherein the first temperature is lower than or equal to 150° C.

11. The method of forming a crystalline oxide semiconductor film according to claim 9, wherein the second temperature is higher than or equal to 250° C.

12. The method of forming a crystalline oxide semiconductor film according to claim 8, wherein the oxide semiconductor contains indium, gallium and zinc as main metal elements.

13. The method of forming a crystalline oxide semiconductor film according to claim 8, wherein the crystalline oxide semiconductor film is a single crystal oxide semiconductor film.

14. The method of forming a crystalline oxide semiconductor film according to claim 8, wherein the film is formed by a vacuum evaporation method or an atomic layer deposition method.

15. A method of forming a crystalline oxide semiconductor film, comprising:
depositing a crystalline film comprising an oxide semiconductor on a substrate with a condition that the substrate is heated to a temperature of higher than or equal to a first temperature and lower than a second temperature and a part of the substrate is heated to a temperature of higher than or equal to the second temperature,
wherein the crystalline film comprising the oxide semiconductor comprises a first portion which is crystalline,
wherein the crystalline film comprising the oxide semiconductor comprises a second portion over the part of the substrate,
wherein the first portion includes the second portion,
wherein an area of the first portion is larger than an area of the second portion,
wherein the first portion is a place where the substrate is heated over the first temperature in the depositing step,
wherein the second portion is a place where the substrate is heated over the second temperature in the depositing step,
wherein the first temperature is a temperature at which crystallization of the oxide semiconductor occurs with a stimulation,
wherein the second temperature is a temperature at which crystallization of the oxide semiconductor occurs spontaneously,
wherein the part of the substrate has a typical length of 1 nm to 1 μm, and
wherein the typical length is a square root of a value obtained by dividing an area of the part by a circular constant.

16. The method of forming a crystalline oxide semiconductor film according to claim 15, wherein the heating the part of the substrate to the temperature of higher than or equal to the second temperature is performed by irradiation with an energy line.

17. The method of forming a crystalline oxide semiconductor film according to claim 16, wherein the energy line is laser light.

18. The method of forming a crystalline oxide semiconductor film according to claim 15, wherein the oxide semiconductor contains indium and zinc as main metal elements.

19. The method of forming a crystalline oxide semiconductor film according to claim 15, wherein the oxide semiconductor contains indium, gallium and zinc as main metal elements.

20. The method of forming a crystalline oxide semiconductor film according to claim 15, wherein the crystalline oxide semiconductor film is a single crystal oxide semiconductor film.

21. The method of forming a crystalline oxide semiconductor film according to claim 15, wherein the first temperature is lower than or equal to 150° C.

22. The method of forming a crystalline oxide semiconductor film according to claim 15, wherein the second temperature is higher than or equal to 250 C.

23. The method of forming a crystalline oxide semiconductor film according to claim 15, wherein the oxide semiconductor is formed by a sputtering method.

24. The method of forming a crystalline oxide semiconductor film according to claim 15, wherein the film is formed by a vacuum evaporation method or an atomic layer deposition method.

25. A method of forming a crystalline oxide semiconductor film, comprising:
depositing a first crystalline film comprising an oxide semiconductor on a substrate by a sputtering method while irradiation with an energy line is performed to assist crystallization of the oxide semiconductor, and
depositing a second crystalline film comprising the oxide semiconductor without irradiation with the energy line on the first film, the second crystalline film being deposited with a condition that the substrate is heated to a temperature of higher than or equal to a first temperature and lower than a second temperature by a sputtering method,
wherein the first temperature is a temperature at which crystallization of the oxide semiconductor occurs with a stimulation, and
wherein the second temperature is a temperature at which crystallization of the oxide semiconductor occurs spontaneously.

26. The method of forming a crystalline oxide semiconductor film according to claim 25,
wherein a temperature of a part of the substrate is higher than or equal to a temperature at which crystallization of the oxide semiconductor occurs spontaneously by the irradiation.

27. The method of forming a crystalline oxide semiconductor film according to claim 26,
wherein the part of the substrate has a typical length of 1 nm to 1 μm, and
wherein the typical length is a square root of a value obtained by dividing an area of the part by a circular constant.

28. The method of forming a crystalline oxide semiconductor film according to claim 25, wherein the energy line is laser light.

29. The method of forming a crystalline oxide semiconductor film according to claim 25, wherein the oxide semiconductor contains indium and zinc as main metal elements.

30. The method of forming a crystalline oxide semiconductor film according to claim 25, wherein the oxide semiconductor contains indium, gallium and zinc as main metal elements.

31. The method of forming a crystalline oxide semiconductor film according to claim 25, wherein the crystalline oxide semiconductor film is a single crystal oxide semiconductor film.

32. The method of forming a crystalline oxide semiconductor film according to claim 25,
   wherein the temperature at which the crystallization of the oxide semiconductor occurs spontaneously is higher than or equal to 250° C.

* * * * *